July 19, 1966 D. F. HILBIBER 3,262,064

TEMPERATURE-STABLE DIFFERENTIAL AMPLIFIER

Filed Dec. 3, 1962

INVENTOR.
DAVID F. HILBIBER

United States Patent Office 3,262,064

Patented July 19, 1966

3,262,064

TEMPERATURE-STABLE DIFFERENTIAL AMPLIFIER

David F. Hilbiber, Los Altos, Calif., assignor to Fairchild Camera and Instrument Corporation, Syosset, Long Island, N.Y., a corporation of Delaware Filed Dec. 3, 1962, Ser. No. 241,617
6 Claims. (Cl. 330—23)

This invention relates to a differential amplifier having substantially reduced temperature sensitivity.

In general, a differential amplifier circuit consists of two channels, each having an input terminal and an output terminal. The output signal is governed mainly by the difference between the initial input signal levels, rather than by their average level. Ideally, the output signal should be a function of the difference only, so that in an ideal differential amplifier circuit the output is zero when the input signals to each channel of the amplifier are identical.

In transistor differential amplifiers, two problems arise which cause them to deviate from this ideal. The first one is the great difficulty in obtaining transistors which are absolutely identical. Even a very small difference between the characteristics of two transistors may have appreciable effect in sensitive circuit applications. The second difficulty is that even when transistors have identical characteristics at a given reference temperature, differences will be observed in most cases whenever the temperature varies substantially from the reference.

Since it is not feasible, on a commercial scale of manufacture, to select identical transistors for the two channels of the differential amplifier, it has become common to compensate within the circuit for the differences in transistor characteristics. This is usually accomplished through a variation in the emitter resistance values which are adjusted, with respect to each other, until at a predetermined temperature substantially zero output signal is obtained for equal input signals. To minimize the amount of compensation required, the remaining components in each channel are chosen to be as nearly identical as possible.

Even with components as nearly identical as commercially practical and emitter resistances adjusted to compensate for the remaining differences, normal operating temperature variations will introduce substantial error into a differential amplifier circuit. Numerous attempts have been made in the prior art to eliminate this temperature drift. One method is to operate the temperature-sensitive elements in a controlled environment, such as an oven; this method necessarily requires added power input for heating and a time interval to attain thermal equilibrium. Another method is to use feedback amplification to sense the amount of the drift and feed back a corrective signal. Such apparatus is necessarily complex and tends to introduce undesirable signals (noise) into the system; furthermore, solid-state amplifiers, which are normally used for feedback, are just as susceptible to the temperature-drift problems as the differential amplifier which is to be corrected.

The present invention provides a means of achieving a large reduction in the temperature sensitivity of a differential amplifier, which in turn substantially eliminates the temperature drift. This reduction is accomplished by a modification in the circuit of the amplifier itself, thereby avoiding the prior-art problems mentioned above. The differential amplifiers of this invention use a circuit configuration which directly contradicts the generally accepted principles of differential amplifier circuitry. Instead of the careful selection of nearly identical components for each channel, a deliberate imbalance is introduced into the collector currents. This deliberate imbalance results in a considerable reduction in the temperature sensitivity of the amplifier.

In its essentials, the differential amplifier of this invention has at least two transistors. These will, as stated, have slightly different temperature characteristics because it is almost impossible, even with mass-production techniques, to manufacture completely identical transistors. The transistors are placed in a circuit so designed that their collector currents are related by the equation $$I_{c1}=nI_{c2}$$

wherein $I_{c1}$ is the collector current in one transistor and $I_{c2}$ is the collector current in the other. Calculation of the proportionality constant, $n$, will be explained later. The required imbalance may be most easily achieved by varying the effective collector resistances in each channel so that $$R_{c1}=\frac{1}{n}R_{c2}$$

Additional adjustment may be made by introducing imbalance into the voltage or current source for each channel. Whatever means are used, the collector currents should be unbalanced until they are related by the above equation.

The emitter currents are then balanced by conventional means so that the output signal is substantially zero for a zero input signal. In most cases, this is easily accomplished by adjusting the emitter resistors of each channel. The input signal is conventionally applied across the bases of each of the transistors, and the output signal received across the collectors.

The invention may be better understood from the following more detailed description and the drawings, in which.

Figure 1:
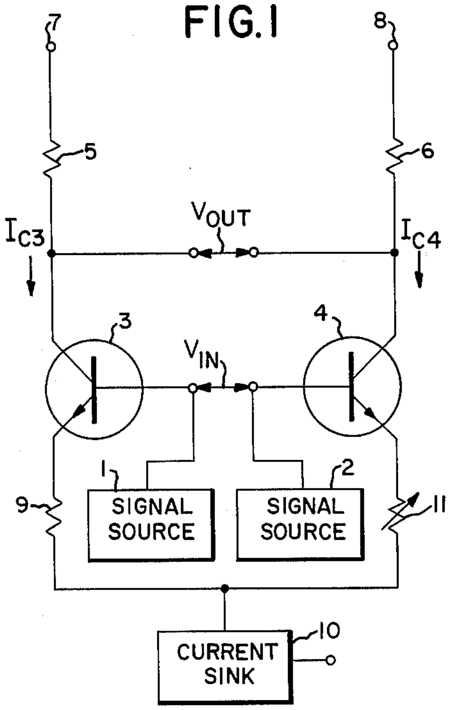
FIG. 1 is a schematic circuit diagram showing one embodiment of the invention.

Referring now to FIG. 1, a simple differential amplifier circuit is shown. Two signals 1 and 2 are introduced into the bases of transistors 3 and 4, respectively. The voltage difference between the two signals is $\Delta V_{in}$. The circuit design requires two transistors having similar characteristics; however, since they will not be completely identical, their characteristics will generally vary somewhat with different temperatures. Before the temperature sensitivity of the circuit can be improved according to this invention, the circuit must first be balanced.

Identical collector resistors 5 and 6 are now connected to the collectors of transistors 3 and 4, respectively. The other terminal of each of these resistors is connected to equal voltage source 7 or 8, respectively. Fixed resistor 9 is connected between the emitter of transistor 3 and common current sink 10; variable resistor 11 is connected between the emitter of transistor 4 and current sink 10.

Two identical input signals are now sent into the bases of transistors 3 and 4 ($\Delta V_{in}=0$); the output voltage $\Delta V_{out}$ is then measured. The transistors are maintained at constant temperature during this operation. Variable resistor 11 is now adjusted until $\Delta V_{out}=0$ when $\Delta V_{in}=0$. This completes the initial balancing of the amplifier.

The input temperature drift factor of the amplifier, $K_o$, is now calculated, prior to further adjustment of the amplifier according to the invention. The temperature of the entire amplifier is changed from the initial temperature $T_1$ (at which $\Delta V_{in}=\Delta V_{out}=0$) to temperature $T_2$. (Although the transistors are the most temperature-sensitive elements, there is sometimes enough sensitivity in the remainder of the circuit to make it advisable to change the temperature of the entire amplifier.) $K_o$ is then determined from the equation $$K_o=\frac{\Delta V_{\text{out at } T_2}}{A\Delta T} \qquad (1)$$

where $\Delta T=T_2-T_1$, and A is the amplification factor.

In some instances, temperature drift will occur in portions of a system which includes a differential amplifier, yet this drift is not entirely caused by the amplifier itself. Often, for example, an input signal source (e.g., a trandsucer) will be itself temperature-sensitive. However, as long as this temperature drift remains linear, it can be corrected within the differential amplifier in the same manner as the drift of the amplifier itself. In such cases, when the output voltage of the differential amplifier is measured at two different temperatures $T_1$ and $T_2$ to establish $K_o$, the temperature of the input source (that is, the transducer is also changed from $T_1$ to $T_2$. Calculation of $K_o$ will then include the temperature-drift factor of the input source.

With the input temperature drift factor $K_o$ calculated for the differential amplifier (and its input source, if desired), the circuit is then unbalanced according to the invention. Imbalance is deliberately introduced into the collector circuit by adjusting the collector currents of transistors 3 and 4 so that $$I_{c3}=nI_{c4} \qquad (2)$$

where $$K_o-K=\frac{k}{q}\ln(n) \qquad (3)$$

$$\frac{k}{q}=\frac{1.38\times10^{-23}\text{ (Boltzmann's constant)}}{1.6\times10^{-19}\text{ (the charge on an electron)}}=8.63\times10^{-5}$$

and K is the desired reduced input temperature drift factor of the amplifier. In order to obtain a substantial advantage from the invention, K should be at least 25% less in value than $K_o$, and preferably 75% less. Ideally, of course, $K=0$. Then, from Equation 3, above, $$K_o=\frac{k}{q}\ln(n),\text{ or } n=e^{K_o\frac{q}{k}}=e^{1.16K_o\times10^4}$$

The ideal $n$ is then calculated from the calculated value of $K_o$ [Equation 1]. Broadly speaking, where only a 25% reduction in drift is required, $K=.75K_o$, so $$.25K_o=\frac{k}{q}=\ln(n),\text{ or } n=e^{.29K_o\times10^4}$$

a reduction of at least 75% is usually desired, so that $$n=e^{.87K_o\times10^4}$$

In general, the easiest way to adjust collector currents so that they are related according to Equation 2 is to adjust collector resistances $R_5$ and $R_6$ so that $nR_5=R_6$. The values of resistances $R_5$ and $R_6$ are inversely proportional to the collector currents of transistors 3 and 4, respectively. Emitter resistors 9 and 11 are then adjusted to restore balance to the circuit.

Alternatively, the sequence of adjustments may be altered to unbalance the circuit by adjusting emitter resistors 9 and 11 to satisfy Equation 2, and then adjusting collector resistors 5 and 6 to restore balance. Still another method of adjusting these collector currents is to vary the magnitudes of voltage sources 7 and 8 until Equation 2 is satisfied.

Whichever of the above procedures is used, when the collector circuits are adjusted to satisfy Equation 2 the differential amplifier circuit of this invention is completed.

Figure 2:
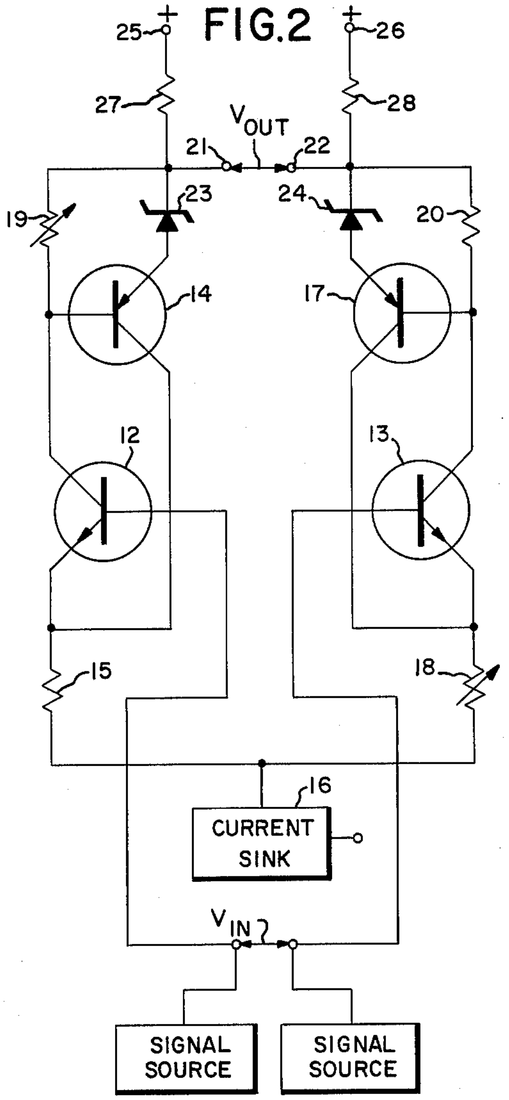
FIG. 2 is a schematic circuit diagram showing another embodiment of the invention, using four transistors.

Another embodiment of the invention is shown in FIG. 2. Input signal $\Delta V_{in}$ is fed to the bases of transistors 12 and 13 in the same manner as in the first embodiment. The emitter of transistor 12 is connected to the collector of transistor 14, and also to current sink 16 through resistor 17. The emitter of transistor 13 is connected to the collector of transistor 17 and to current sink 16 through variable resistor 18. The collectors of transistors 12 and 13 are connected to the bases of transistors 14 and 17, respectively; they are also connected to output terminals 21 and 22 through resistors 19 and 20, respectively. The emitters of transistors 14 and 17 are connected to outputs 21 and 22 through breakdown diodes 23 and 24, respectively. The two channels of the circuit are powered by voltage or current sources 25 and 26 through resistors 27 and 28, respectively.

This circuit is balanced initially in the same manner as the two transistor circuit. Resistor 18 is adjusted so that the $\Delta V_{out}$ across terminals 21 and 22 is zero when $\Delta V_{in}$ is zero. The initial temperature drift factor of the circuit, $K_o$, is obtained by measuring the output voltage $\Delta V_{out}$ at two different temperatures, using the same input voltage $\Delta V_{in}=0$. The value of $n$ is then calculated as explained above. The collector currents of the transistors 12 and 13 are now adjusted so that they are related by the proportionality constant $n$. This is accomplished by varying one of resistors 19 and 20, or one of resistors 15 and 18, or by varying sources 25 and 26. After this adjustment, one of the resistors from a pair not used in the adjustment is varied, to reset the zero point ($\Delta V_{out}=0$ when $\Delta V_{in}=0$).

Figure 3:
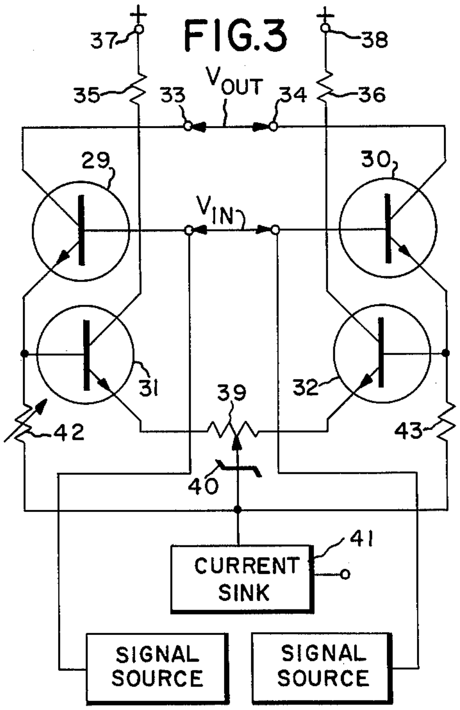
FIG. 3 is a schematic circuit diagram of still another embodiment of the invention, also using four transistors.

Another differential amplifier circuit applying the principles of the invention is shown in FIG. 3. Here a signal is fed to the bases of transistors 29 and 30, whose emitters are connected to the bases of transistors 31 and 32, respectively; their collectors are connected to terminals 33 and 34 (the output signal) and to resistors 35 and 36. This circuit is powered by voltage or current sources (not shown) at terminals 37 and 38. The collectors of transistors 31 and 32 are also connected to output terminals 33 and 34, and their emitters are connected to variable resistor 39. This resistor is also connected through breakdown diode 40 to current sink 41. The base of transistor 31 and the emitter of transistor 29 are connected to current sink 41 through variable resistor 42, and the emitter of transistor 30 and the base of transistor 32 are connected to current sink 41 through resistor 43.

As with the previous circuits, emitter resistance 39 is varied until the output potential $\Delta V_{out}$ is zero when $\Delta V_{in}$ is zero. Using the same $\Delta V_{in}=0$, $\Delta V_{out}$ is measured again at a different temperature so that the initial temperature drift factor $K_o$ may be calculated. Next, the ratio of the collector currents, $n$, is calculated as described above. In this circuit, the collector currents may be adjusted by varying the magnitudes of resistors 42 and 43 until their ratio is $n$; this is done by adjusting variable resistor 42, which alters the emitter currents of transistors 29 and 30 in the same proportion. Alternatively, the power sources to inputs 37 and 38 may be adjusted to unbalance the collector currents in the correct proportion. Emitter resistor 39 is then adjusted so that $\Delta V_{out}=0$ when $\Delta V_{in}=0$, and the circuit of the invention is completed.

The advantages of the invention may easily be seen from the following examples. These are provided only to illustrate the operation of specific circuits of the invention, and are therefore not to be construed as placing further limitation on its scope.

*Example I*

Using the previously balanced circuit of FIG. 2 having an amplification factor $A=50$, the output voltage $\Delta V_{out}$ was measured for a fixed input voltage $\Delta V_{in}$ at 30° C. and again at 100° C.; a difference of 0.022 volt was observed. The temperature coefficient was then calculated from Equation 1 as follows:

$$K_o=\frac{.022}{70\times50}=6.3\mu V/°\text{ C.}$$

Since the emitter-base voltages of transistors 12 and 13 are decreasing with increasing temperatures, it follows that $V_{be12}$ is decreasing less rapidly than $V_{be13}$. To correct this, $I_{c12}$ must be reduced to reduce $V_{be12}$, and $R_{18}$ is therefore reduced so that $R_{18}=nR_{15}$. Now follows the calculation of $n$:

$$n=e^{1.16K\times10^4}$$

Therefore, $R_{18}=1.076R_{15}$. After the adjustment of $R_{18}$, $R_{19}$ was readjusted so that $\Delta V_{out}=0$ when $\Delta V_{in}=0$. The output voltage $\Delta V_{out}$ was measured again at 30° and at 100° C. with a constant input voltage $\Delta V_{in}=0$; a difference of 0.00175 was now observed. This variation is less than 1/12 of that obtained with the same circuit without the adjustment of collector currents according to the invention.

*Example II*

This example illustrates the values of $n$ required to achieve various reductions in temperature sensitivity. The circuit used is that of FIG. 1, wherein:

$$V_7=V_8=18 \text{ v.}$$
$$R_9+R_{11}=4{,}000\Omega$$
$$R_5=R_6=100{,}000\Omega \text{ (initially)}$$
$$K_o=9.8\mu V/° \text{ C. between } +21° \text{ C. and } -20° \text{ C.}$$
$$A=42.2$$

To decrease drift factor, $R_5$ and $R_6$ were adjusted so that $nR_5=R_6$.

| Final Drift Factor K(μV/° C.) | n |
|---|---|
| $K_o$=9.8 | 1.0 |
| .75 $K_o$=7.35 | 1.030 |
| .25 $K_o$=2.45 | 1.091 |
| 0 | 1.121 |

The above table shows that a drift factor reduction of about 25% requires approximately a three percent increase in one of the resistors ($R_5$); a 75% reduction requires a nine percent increase; and substantially complete elimination of drift over the temperature range tested (within measurement limits) would require a twelve percent increase in the value of resistor $R_5$, making $R_5$=112,100 ohms.

As will be apparent to one skilled in the art, the inventive concept disclosed is applicable to many circuits which depart substantially from the specific examples disclosed in this specification. Therefore, the only limitations to be placed on the scope of the invention are those set forth in the following claims.

What is claimed is:

1. A method for reducing the temperature sensitivity of a two-channel differential amplifier having at least one transistor in each channel, said transistors having a base, a collector, and an emitter, which comprises:

setting the collector currents $I_{c1}$ and $I_{c2}$ so that they are approximately related by the equation $$I_{c1}=nI_{c2}$$

wherein $n=e^{(K_o-K)q/k}$ $q$=the charge on an electron, $k$=Boltzmann's constant, $K$ is between about 0 to $0.75K_o$, and $K_o$ is the initial temperature input drift factor of the amplifier measured with substantially equal collector currents, and setting the emitter currents so that $\Delta V_{out}$ equals a predetermined value when $\Delta V_{in}$ equals a predetermined value.

2. A method for reducing the temperature sensitivity of a two-channel differential amplifier having at least one transistor in each channel, said transistors having a base, an emitter, and a collector, and said amplifier having a separate resistor in series with each of said collectors and in series with each of said emitters, at least one of said resistors in series with one of said collectors and at least one of said resistors in series with one of said emitters being variable, which comprises:

setting the resistance of said variable resistors in series with said collector so that its resistance, $R_1$, is related to the resistance of the other resistor in series with the other collector, $R_2$, by a factor of $n$, wherein $n=e^{(K_o-K)q/k}$ $q$=the charge on an electron, $k$=Boltzmann's constant, $K$ is between about 0 to $0.75K_o$, and $K_o$ is the initial temperature input drift factor of the amplifier measured with substantially equal collector currents, and setting the resistance of the variable resistor in series with said emitter so that $\Delta V_{out}$ equals a predetermined value when $\Delta V_{in}$ equals a predetermined value.

3. A method for reducing the temperature sensitivity of a two-channel differential amplifier having at least one transistor in each channel, said transistors having a base, an emitter, and a collector, and said amplifier having a separate resistor in series with each of said collectors and in series with each of said emitters, at least one of said resistors in series with one of said collectors and at least one of said resistors in series with one of said emitters being variable, which comprises:

setting the resistance of said variable resistors in series with said emitter so that its resistance, $R_1$, is related to the resistance of the other resistor in series with the other emitter, $R_2$, by a factor of $n$, wherein $n=e^{(K_o-K)q/k}$ $q$=the charge on an electron, $k$=Boltzmann's constant, $K$ is between about 0 to $0.75K_o$, and $K_o$ is the initial temperature input drift factor of the amplifier measured with substantially equal collector currents, and setting the resistance of the variable resistor in series with said collector so that $\Delta V_{out}$ equals a predetermined value when $\Delta V_{in}$ equals a predetermined value.

4. A method for obtaining a system containing a two-channel differential amplifier which has a predetermined temperature input drift factor K, wherein said amplifier has at least one transistor in each channel, said transistors having a base, a collector, and an emitter, which comprises:

setting the collector currents $I_{c1}$ and $I_{c2}$ so that they are approximately related by the equation $$I_{1c}=nI_{c2}$$

wherein $n=e^{(K_o-K)q/k}$ $q$=the charge on an electron, $k$=Boltzmann's constant, $K$=the final temperature input drift factor of the amplifier, $K_o$ is the initial temperature input drift factor of the amplifier measured with substantially equal collector currents, and setting the emitter currents so that $\Delta V_{out}$ equals a predetermined value when $\Delta V_{in}$ equals a predetermined value.

5. A method for reducing the temperature sensitivity of a system containing a two-channel differential amplifier having at least one transistor in each channel, said transistors having a base, a collector, and an emitter, which comprises:

setting the collector currents $I_{c1}$ and $I_{c2}$ so that they are approximately related by the equation $$I_{c1}=nI_{c2}$$

wherein $n=e^{(K_o-K)q/k}$ $q$=the charge on an electron, $k$=Boltzmann's constant, $K$ is between about 0 to $0.75K_o$, and $K_o$ is the initial temperature input drift factor of the system measured with substantially equal collector currents in the amplifier, and setting the emitter currents so that $\Delta V_{out}$ equals a predetermined value when $V_{in}$ equals a predetermined value.

6. A method for adjusting the temperature sensitivity of a two-channel differential amplifier having at least one transistor in each channel, said transistors having a base, a collector, and an emitter, which comprises:

setting the collector currents $I_{c1}$ and $I_{c2}$ so that they are approximately related by the equation $$I_{c1}=nI_{c2}$$

wherein $n=e^{(K_o-K)q/k}$ $q$=the charge on an electron, $k$=Boltzmann's constant, $K_o$ is the initial temperature input drift factor of the amplifier measured with substantially equal collector currents, and $K$ is the adjusted temperature input drift factor, and setting the emitter currents so that $\Delta V_{out}$ equals a predetermined value when $\Delta V_{in}$ equals a predetermined value.

References Cited by the Examiner

UNITED STATES PATENTS 3,003,113 10/1961 MacNichol ---------- 330—69

3,077,566 2/1963 Vosteen ----------- 330—30 X

ROY LAKE, *Primary Examiner.*

N. KAUFMAN, *Assistant Examiner.*